United States Patent [19]

Yumoto

[11] Patent Number: 4,812,353
[45] Date of Patent: Mar. 14, 1989

[54] PROCESS FOR THE PRODUCTION OF CIRCUIT BOARD AND THE LIKE

[75] Inventor: Tetsuo Yumoto, Tokorozawa, Japan

[73] Assignee: Sankyo Kasei Kabushiki Kaisha, Tokyo, Japan

[21] Appl. No.: 109,357

[22] Filed: Oct. 15, 1987

[30] Foreign Application Priority Data

Dec. 27, 1986 [JP] Japan .................................. 61-309079
Jan. 20, 1987 [JP] Japan .................................... 62-8992

[51] Int. Cl.⁴ .............................................. B05C 3/107
[52] U.S. Cl. ........................................ 428/172; 427/96; 427/98; 264/129; 264/135
[58] Field of Search ................... 427/96, 98; 264/129, 264/135

[56] References Cited

U.S. PATENT DOCUMENTS

| | | | |
|---|---|---|---|
| 3,884,704 | 5/1975 | Rantell | 427/98 |
| 4,389,771 | 6/1983 | Cassidy | 427/98 |
| 4,430,154 | 2/1984 | Stahl | 427/96 |
| 4,451,505 | 5/1984 | Jaus | 427/98 |
| 4,470,883 | 9/1984 | Eichelberger | 427/96 |
| 4,532,152 | 7/1985 | Elarde | 427/96 |
| 4,574,031 | 3/1986 | Dorey | 427/96 |

FOREIGN PATENT DOCUMENTS

| | | | |
|---|---|---|---|
| 192233 | 8/1986 | European Pat. Off. | 427/96 |
| 71272 | 6/1978 | Japan | 427/98 |
| 217695 | 10/1985 | Japan | 427/98 |
| 2038101 | 7/1980 | United Kingdom | 427/96 |

Primary Examiner—Shrive Beck
Assistant Examiner—Vi Duong Dang
Attorney, Agent, or Firm—Jordan and Hamburg

[57] ABSTRACT

A process for the production of a molded article such as a circuit board and the like includes applying catalyst such as palladium, gold, etc. to a primary molded article after roughening of its surfaces, then, after such pretreatment, the primary molded article is set into a mold to form a secondary molded article covered with cover material only leaving a portion to be subjected to metal plating, and then the secondary molded article is removed from the mold and subjected to metal plating, and finally the cover material is removed after metal plating.

20 Claims, 3 Drawing Sheets

PROCESS FOR THE PRODUCTION OF CIRCUIT BOARD AND THE LIKE

BACKGROUND OF THE INVENTION

This invention relates to a process for the production of a molded article such as a circuit board, connector, etc. which are partially plated with metal.

The applicant of this invention proposed a process for the production of a plastic molded article partially plated with metal. The process for the production of a circuit board is described as one of such production processes. Firstly, the circuit board as a primary molded article is formed with a mold, and the surfaces of the circuit board are roughened, then a catalyst is added for conducting pre-treatment of the circuit board, and the pre-treated circuit board is set into the mold and covered with plastics leaving the circuit portions only, thus forming the circuit board as a secondary molded article of which circuit portions only are exposed. Then, after having been removed from the mold, the circuit board is plated with metal as a final step to become the product in which the circuit portion only is plated with metal.

Any kind of plastics can be used in the production process mentioned above. However, when the material mixed with such filler as glass fibre is used, the cost for production will be expensive. Likewise, when such resin that needs to be injected with high pressure is used, the circuit portions need to be high in height and wide in width. Thus the circuit board as a whole becomes thicker, presenting limitation for making the board thinner and smaller.

DETAILED DESCRIPTION OF THE INVENTION

This invention involves two processes for production as shown below.

The first process for production is composed of the step of conducting pre-treatment of the primary molded particle 1 by applying a catalyst such as gold, silver, platinum, etc. after roughening of the surfaces of the primary molded article 1, the step for setting the pre-treated molded article into the mold to form the secondary molded article covered with cover material 2a leaving only the portion to be plated with metal, that is to say, the portion on which the metal plating film 3a is formed, the step for plating with metal the secondary molded article after removing it from the mold after molding, and the step for removing cover material 2a after metal plating.

The second process for production of this invention includes the step of roughening the surfaces of the primary molded article 1 and for conducting pre-treatment of the primary molded article by applying for instance a catalyst such as gold, silver, platinum, etc., the step for effecting electroless metal plating such as electroless copper plating and electroless nickel plating as primary metal plating of the molded article, the step of setting the metal plated primary molded article into the mold M to form the secondary molded article covered with resisting film 2a as cover material, leaving the portion to be secondarily plated with metal, i.e. the portion to form the metal plating film 3a, the step for conducting metal plating of this secondary molded article after molding and removing it from the mold, and the step for removing the resisting film 2a after secondary metal plating and removing base layer 11 below the resisting film.

In both production processes, such material as plastics or ceramics etc. can properly be selected as the material for the primary molded article, depending on the use of the molded article. As a cover material 2a in the process for forming the secondary molded article, such electrically insulating materials as plastics and natural rubber which are in the state of monomer and tend to get hardened with heat, light, air, or electron beam, etc. after being injected into the mold can be used. In cases when the surfaces of the primary molded article are soiled with the mold removing agent or fatty substance after the molding of the molded article, it is especially recommendable to remove the fatty substance. When plastics is used in the molding process of the primary molded article, an organic solvent such as methylethy ketone or acetone or a surface active agent can be used for removing fatty substances depending on the kind of plastics, for instance, in the case of polyamide resin. Further, the process for pre-treatment can be done in a publicly known way. Each kind of etching solution is used to improve the adhering strength of the metal plating in the process for pre-treatment. When the primary molded article is made of polyphenylene sulfide resin, such etching solutions are chromic acid/sulfuric acid, acidic ammonium fluoride/nitric acid, hydrofluoric acid/nitric acid are suitable. Also, when the primary molded article is made of plastics, the way to apply catalyst to the molded article, recommended as practicable, will be catalyst→accelerator method and sensitizing→activation method. The former is a method to separate palladium on the surfaces of the primary molded article, by activating by means of such acid as hydrochloride acid, sulfuric acid after submerging in the catalyst solution mixed with the family of tin and palladium. In the latter process, however there is a relatively strong reducing agent such as tin chloride, hypoposphorous acid, hydrazinium chloride, etc. absorbed to the surfaces of the molded articles, then submerged in the catalytic solution containing the ion of such precious metal as gold and palladium to separate precious metal on the surfaces of the molded article.

As a way for removing the cover material 2a, a stripping-off of the cover material, dissolution by using solvents or disintegration can be applied. Also, the process for removing involves, depending on the kind of the product, both the process of stripping off or dissolving and the process of product washing to be conducted after that.

In the first production process, usually either chemical copper plating or chemical nickel plating is conducted in the metal plating step of the secondary molded article. If the molded article is, for instance, a wiring board, it is advisable to adopt copper plating.

In the second production process, however, the metal plating to be adopted in the secondary metal plating process is selected either from electroless metal plating or electric metal plating. In the case when electroless metal plating is adopted, usually chemical copper plating or chemical nickel plating is used. The metal plating of the primary molded article 1 is significant in the case when the primary molded article is made of electrically insulating material and electric metal plating is done in the secondary metal plating process. It is all right if the thickness of the base layer 11 of the primary metal plating is smaller than that of the metal plated film 3a. For instance, if the molded article is a circuit board, then the desirable range of the thickness of the base layer will be between 0.5 μm and 5 μm.

The object of this invention is to make it possible to develop a products with certainty at low cost and to realize thinner products or to miniaturize the products.

The characteristics of this invention will better be understood by the following explanation made with reference to the drawings.

DESCRIPTION OF THE PREFERRED EMBODIMENT

EXAMPLE 1

An example in the case of the first production process is as follows.

<Molding process of the primary molded article>

Figure 1:
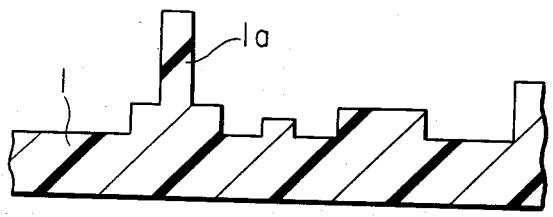
FIG. 1 through FIG. 3 are sectional views showing step by step the molding process of a circuit board according to a first production process of this invention.

A circuit board 1 was formed as a primary molded article as shown in FIG. 1 by using a mold. The circuit board was composed of the components of polyphenylene sulphide resin is provided with a pattern 1a protruding outward.

<Pre-treatment process of the primary molded article>

After being subjected to a treatment for removing fatty substances, the circuit board 1 was submerged for 5 minutes at a temperature of 40° C. in an etching solution composed of acidic ammonium fluoride/nitric acid, and etching was conducted.

After washing the board with water, the board was subjected to sensitizing with tin chloride and activation with palladium chloride and then was dried.

<Molding process of the secondary molded article>

Figure 2:
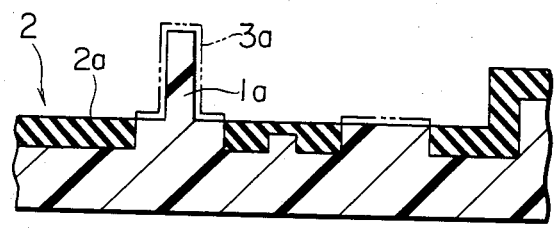
Figure 3:
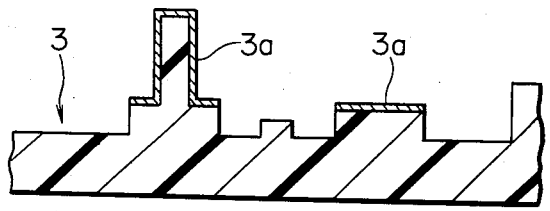

After drying, the circuit board 1 was set in the mold, then the mold was closed and the cavity inside was made vacuous and "Strippable Soldaresist" (brand name produced by Union Chemical Manufacturing Co., Ltd. #S-600) was fed into the cavity as cover material. Thus, the board 2 as the secondary molded article was formed as shown in FIG. 2. In the circuit board 2, only the pattern 1a of the board is exposed to the outside, while the other portions are covered with cover material 2a composed of plastic. <Metal plating process>

After removing fatty substances from the circuit board 2, an electroless copper plating was conducted to the thickness of 20 μm. By doing so, only the outer surface of the pattern 1a was plated with metal as shown by the dotted line of FIG. 2 and the metal plating film 3a was formed.

<Removing process>

After that, the cover material 2a was stripped off from the circuit board, and the circuit board was washed and dried to make it to be a product in the form of the circuit board 3.

EXAMPLE 2

The example in the second production process is as explained below.

<Molding process of the primary molded article>

Figure 4:
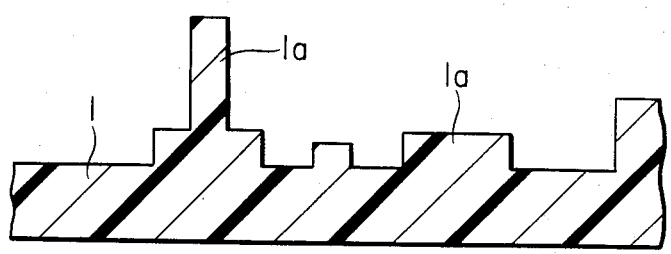
FIG. 4 through FIG. 9 are sectional views showing step by step the molding process of a circuit board according to a second production process of this invention.

The circuit board 1 as a primary molded article was molded with a mold as shown in FIG. 4. The circuit board 1 made of polyphenylene sulphide resin is provided with pattern 1a protruding outward.

<Pre-treatment process of the primary molded article>

After being subjected to a treatment for removing fatty substances, the circuit board 1 was submerged for 5 minutes at a temperature of 40° C. in an etching solution composed of acidic ammonium fluoride/nitric acid and made neutral.

After washing, a sensitizing with tin chloride and an activation with palladium chloride were conducted, and the circuit board was dried.

<Primary metal plating process>

Figure 5:
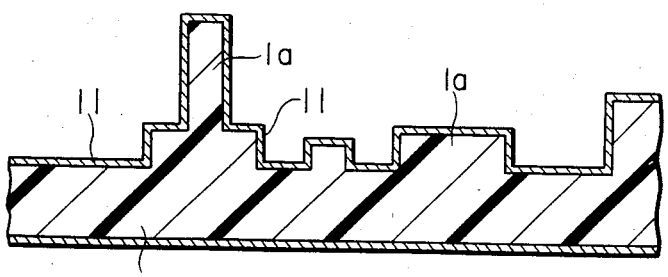
Figure 6:
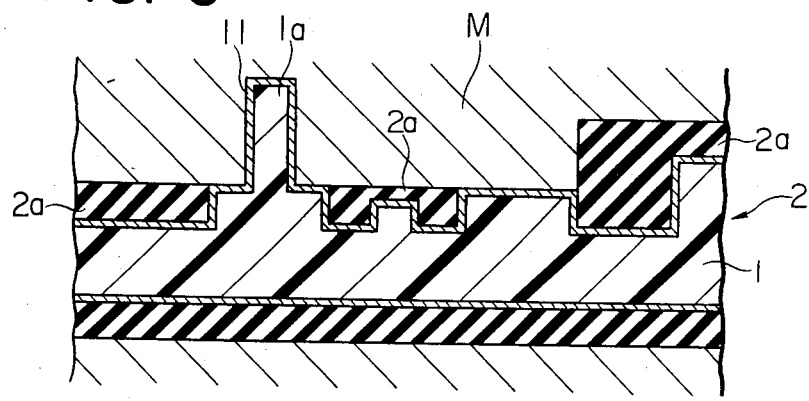

The circuit board 1 was submerged in the solution for electroless copper plating as a base plating and the base layer 11 of 3 μm was formed on the surface as shown in FIG. 5.

<Molding process of the secondary molded article>

After washing and drying, the circuit board 1 was set in a mold having a temperature of 120° C. Then, after closing the mold M and making the cavity inside vacuous, "Strippable Soldaresist" (brand name, manufactured by Union Chemical Manufacturing Co., Ltd. #S-600) was fed as cover material 2a. This cover material hardened in 10 minutes. The circuit board 2 was ready as the secondary molded article after having been removed from the mold. In the circuit board 2, only the pattern 1a of the board is exposed to the outside and the other portions are all covered with resisting film 2a.

<Secondary metal plating process>

Figure 7:
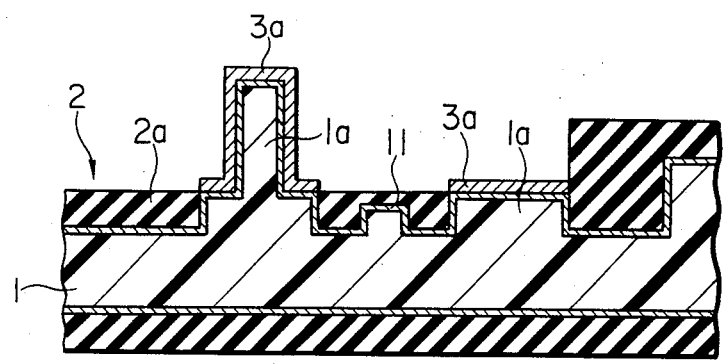

Electric metal plating was conducted by putting a circuit board 2 into the metal plating solution contained in an electric metal plating solution tank, where the base layer 11 was connected to the negative terminal, while the positive electrode was connected to the positive terminal and electricity was supplied. By doing so, only the outer surface of the pattern 1a of the circuit board was plated with metal as shown in FIG. 7 and the metal plating film 3a was formed with a thickness of 20 μm.

<Removing process>

Figure 8:
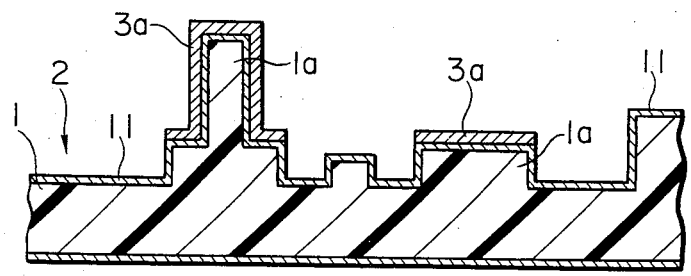
Figure 9:
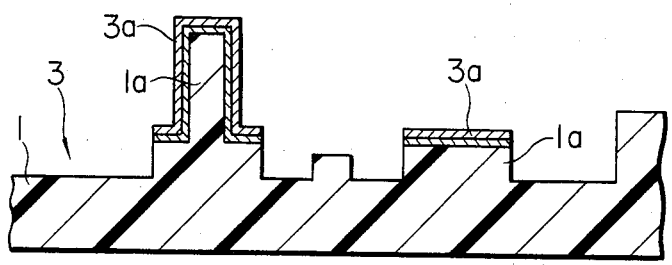

After that, the resisting film 2a was manually stripped off from the circuit board 2 as shown in FIG. 8. Then, the circuit board was subjected to a chemical etching the same as the semi-additive method known in the prior art. Then, by removing the base layer 11 below the resisting film 2a, and by washing and drying, the circuit board 3 as shown as a product in FIG. 9 was obtained.

I claim:

1. A process for producing a molded article comprising the steps of molding within a first mold a primary article having a surface with protrusions, roughening said surface and said protrusions of said primary molded article, treating said roughened surface and said roughened protrusions of said primary article with a catalyst, disposing said primary article with its roughened and catalytically treated surfaces and protrusions within a second mold, molding within said second mold a secondary molded article about said first primary molded article such that at least some outer surface sections of said protrusions are exposed, plating said exposed outer surface sections with metal, and stripping said secondary molded article from said primary molded article.

2. A process according to claim 1 wherein said step of roughening the surface of said primary molded article comprises submerging said primary molded article in an acid etching solution.

3. A process according to claim 2 wherein said acid etching solution is selected from the group consisting of chromic acid/sulfuric acid, acidic ammonium fluoride/nitric acid, and hydrofluoric acid/nitric acid.

4. A process according to claim 1 wherein said catalyst is selected from the group consisting of palladium, gold, silver and platinum.

5. A process according to claim 1 further comprising cleansing said primary molded article with a solvent prior to said roughening step.

6. A process according to claim 1 further comprising cleansing said secondary molded article with a solvent prior to said plating step.

7. A process according to claim 1 wherein said primary molded article comprises a first plastic material.

8. A process according to claim 1 wherein said secondary molded article comprises a plastic material.

9. A process according to claim 1 wherein said primary molded article comprises a ceramic material.

10. A partially plated molded product made according to the process of claim 1.

11. A process for producing a partially plated molded product comprising the steps of molding within a first mold a primary article having a surface with protrusions, roughening said surface and said protrusions of said primary molded article, treating said roughened surface and said roughened protrusions of said primary article with a catalyst, plating said roughened surface and said protrusions with a metal base layer, disposing said primary article with its metal base layer within a second mold, molding within said second mold a secondary molded article over said metal base layer of said primary molded article such that at least some outer surface sections of said protrusions are exposed, plating said exposed outer surface sections with an outer metal layer, and stripping said secondary molded article from said primary molded article.

12. A process according to claim 11 wherein said step of roughening the surface of said primary molded article comprises submerging or dipping said primary molded article in an acid etching solution.

13. A process according to claim 12 wherein said acid etching solution is selected from the group consisting of chromic acid/sulfuric acid, acidic ammonium fluoride/nitric acid, and hydrofluoric acid/nitric acid.

14. A process according to claim 11 wherein said catalyst is selected from the group consisting of palladium, gold, silver and platinum.

15. A process according to claim 11 further comprising cleansing said primary molded article with a solvent prior to said roughening step.

16. A process according to claim 11 further comprising cleansing said secondary molded article with a solvent prior to said plating step.

17. A process according to claim 11 wherein said primary molded article comprises a first plastic material.

18. A process according to claim 11 wherein said secondary molded article comprises a plastic material.

19. A process according to claim 11 wherein said primary molded article comprises a ceramic material.

20. A partially plated molded product made according to the process of claim 11.

* * * * *